United States Patent
Nagarajan et al.

(10) Patent No.: US 8,159,277 B1
(45) Date of Patent: Apr. 17, 2012

(54) TECHNIQUES FOR PROVIDING MULTIPLE DELAY PATHS IN A DELAY CIRCUIT

(75) Inventors: Pradeep Nagarajan, Santa Clara, CA (US); Yan Chong, San Jose, CA (US); Chiakang Sung, Milpitas, CA (US); Joseph Huang, Morgan Hill, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/031,129

(22) Filed: Feb. 18, 2011

Related U.S. Application Data

(60) Provisional application No. 12/549,332, filed on Aug. 27, 2009, now Pat. No. 7,893,739.

(51) Int. Cl.
*H03L 7/06* (2006.01)

(52) U.S. Cl. ........................................ 327/158; 327/149

(58) Field of Classification Search .................. 327/149, 327/158
See application file for complete search history.

(56) References Cited

U.S. PATENT DOCUMENTS

| | | | | |
|---|---|---|---|---|
| 6,182,184 B1 * | 1/2001 | Farmwald et al. | ............. | 710/305 |
| 6,232,806 B1 * | 5/2001 | Woeste et al. | ............. | 327/149 |
| 6,509,776 B2 * | 1/2003 | Kobayashi et al. | ............. | 327/277 |
| 6,724,228 B2 * | 4/2004 | Kashiwazaki | ............. | 327/158 |
| 6,867,627 B1 * | 3/2005 | Murtagh | ............. | 327/158 |
| 7,161,402 B1 * | 1/2007 | Sompur et al. | ............. | 327/158 |
| 7,187,221 B2 * | 3/2007 | Kim et al. | ............. | 327/175 |
| 7,239,575 B2 * | 7/2007 | Kim | ............. | 365/189.05 |
| 7,253,670 B2 * | 8/2007 | Sasaki | ............. | 327/161 |
| 7,451,049 B2 * | 11/2008 | Feiereisel et al. | ............. | 702/68 |
| 7,474,136 B2 * | 1/2009 | Heightley | ............. | 327/175 |
| 7,541,851 B2 * | 6/2009 | Gomm et al. | ............. | 327/158 |
| 7,893,739 B1 * | 2/2011 | Nagarajan et al. | ............. | 327/158 |
| 7,973,577 B2 * | 7/2011 | Gomm et al. | ............. | 327/158 |
| 2004/0008064 A1 * | 1/2004 | Kashiwazaki | ............. | 327/158 |
| 2005/0104639 A1 * | 5/2005 | Anand et al. | ............. | 327/158 |
| 2008/0278211 A1 * | 11/2008 | Heightley | ............. | 327/296 |
| 2009/0295441 A1 * | 12/2009 | Kwak | ............. | 327/158 |
| 2009/0295442 A1 * | 12/2009 | Kwak | ............. | 327/158 |
| 2009/0315600 A1 * | 12/2009 | Becker et al. | ............. | 327/158 |
| 2010/0085095 A1 * | 4/2010 | Kwak | ............. | 327/158 |
| 2010/0123494 A1 * | 5/2010 | Heightley | ............. | 327/158 |
| 2010/0171537 A1 * | 7/2010 | Lee | ............. | 327/158 |
| 2011/0074477 A1 * | 3/2011 | Nagarajan et al. | ............. | 327/158 |
| 2011/0115536 A1 * | 5/2011 | Agarwal | ............. | 327/158 |

OTHER PUBLICATIONS

U.S. Appl. No. 12/248,031, Pradeep Nagarajan et al., entitled "Techniques for Generating PVT Compensated Phase Offset to Improve Accuracy of a Locked Loop," filed Oct. 8, 2008.

\* cited by examiner

*Primary Examiner* — Lincoln Donovan
*Assistant Examiner* — Adam Houston
(74) *Attorney, Agent, or Firm* — Steven J. Cahill

(57) ABSTRACT

A feedback loop circuit includes a phase detector and delay circuits. The phase detector generates an output signal based on a delayed periodic signal. The delay circuits are coupled in a delay chain that delays the delayed periodic signal. Each of the delay circuits includes variable delay blocks and fixed delay blocks that are coupled to form at least two delay paths for an input signal through the delay circuit to generate a delayed output signal. Delays of the variable delay blocks in the delay circuits vary based on the output signal of the phase detector. Each of the delay circuits reroutes the input signal through a different one of the delay paths to generate the delayed output signal based on the output signal of the phase detector during operation of the feedback loop circuit.

20 Claims, 8 Drawing Sheets

TECHNIQUES FOR PROVIDING MULTIPLE DELAY PATHS IN A DELAY CIRCUIT

CROSS-REFERENCE TO RELATED APPLICATION

This patent application is a continuation of U.S. patent application Ser. No. 12/549,332, filed Aug. 27, 2009, which is incorporated by reference herein in its entirety.

BACKGROUND OF THE INVENTION

The present invention relates to electronic circuits, and more particularly, to techniques for providing multiple delay paths in a delay circuit.

FIG. 1A illustrates a prior art delay line circuit used in a delay-locked loop (DLL) circuit. The delay line circuit of FIG. 1A includes 16 delay circuits 10-25 that are coupled in series and a 5-to-1 multiplexer circuit 50. Delay circuits 10-25 delay a reference clock signal REFCK. A counter control signal CCS controls the delays of the delay circuits 10-25. Multiplexer 50 selects a delayed version of the reference clock signal from the output of one of the delay circuits 15, 17, 19, 21, or 25 to generate a feedback clock signal FBCK based on the logic states of static select signals. The logic states of the static select signals remain constant during the operation of the DLL. FBCK is transmitted to a phase detector in the DLL.

Each of the delay circuits 10-25 includes the circuit architecture shown in FIG. 1B. FIG. 1B includes 1x delay circuits 101-108 and 2-to-1 multiplexer 110. Each of the delay circuits 101-108 includes a current starving inverter coupled in series with a standard CMOS inverter. Each of the current starving inverters in delay circuits 101-108 is a variable delay circuit that includes 9 PMOS transistors coupled in parallel and 9 NMOS transistors coupled in parallel. The PMOS and NMOS transistors can generate 9 different delay options for the current starving inverter.

Delay circuits 101-104 are coupled in series to delay the input clock signal at the Input of delay circuit 101 to generate a delayed clock signal at the high frequency input of multiplexer 110. Delay circuits 101-108 are coupled in series to delay the input clock signal at the Input of delay circuit 101 to generate a delayed clock signal at the low frequency input of multiplexer 110. Multiplexer 110 selects either the delayed clock signal at the low frequency input or the delayed clock signal at the high frequency input as an output clock signal at the Output based on the logic state of a static select signal. The logic state of the static select signal remains constant during the operation of the DLL. The delay options in delay circuits 101-108 are dynamically adjusted by the combination of a phase detector and counter circuit during operation of the DLL.

BRIEF SUMMARY OF THE INVENTION

According to an embodiment, a feedback loop circuit includes a phase detector and delay circuits. The phase detector generates an output signal based on a delayed periodic signal. The delay circuits are coupled in a delay chain that delays the delayed periodic signal. Each of the delay circuits includes variable delay blocks and fixed delay blocks that are coupled to form at least two delay paths for an input signal through the delay circuit to generate a delayed output signal. Delays of the variable delay blocks in the delay circuits vary based on the output signal of the phase detector. Each of the delay circuits reroutes the input signal through a different one of the delay paths to generate the delayed output signal based on the output signal of the phase detector during operation of the feedback loop circuit.

According another embodiment, a feedback loop circuit includes a phase detector and a delay line. The phase detector generates an output signal in response to a delayed periodic signal. The delay line includes delay circuits coupled in series that delay a periodic signal to provide a delay to the delayed periodic signal. Each of the delay circuits includes adjustable delay blocks that are configurable to route an input signal through either one of at least two different delay paths through the adjustable delay blocks to generate a delayed output signal. Delays of a first set of the adjustable delay blocks vary based on the output signal of the phase detector. Delays of a second set of the adjustable delay blocks remain constant in response to fixed delay signals when the feedback loop circuit is operating.

Various objects, features, and advantages of the present invention will become apparent upon consideration of the following detailed description and the accompanying drawings.

DETAILED DESCRIPTION OF THE INVENTION

Figure 1A:
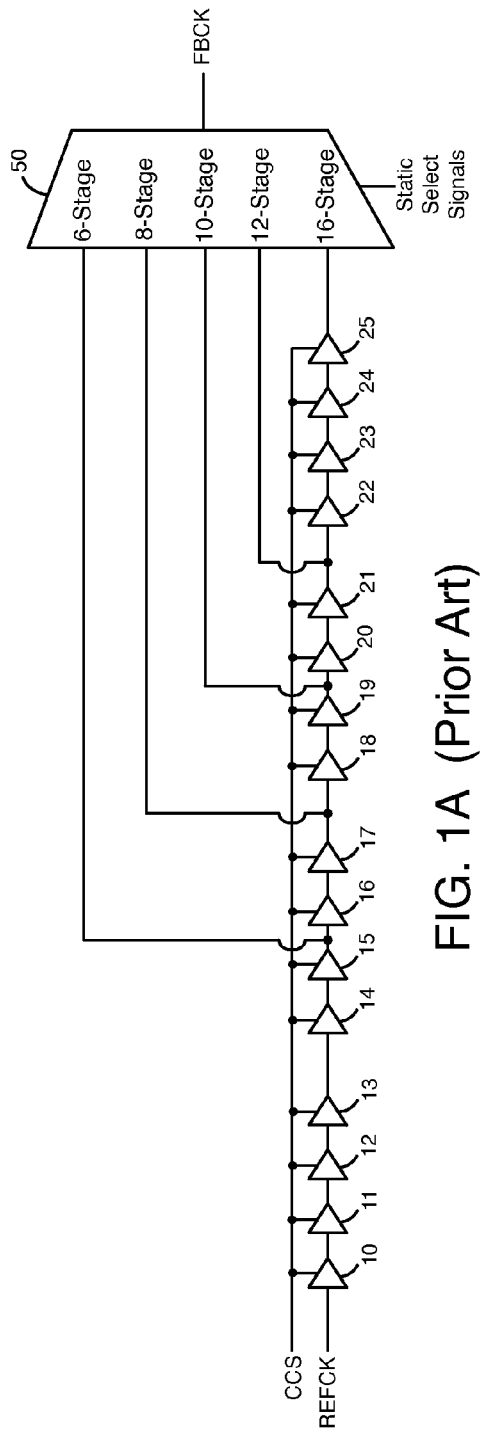
FIG. 1A illustrates a prior art delay line circuit used in a delay-locked loop (DLL) circuit.
Figure 1B:
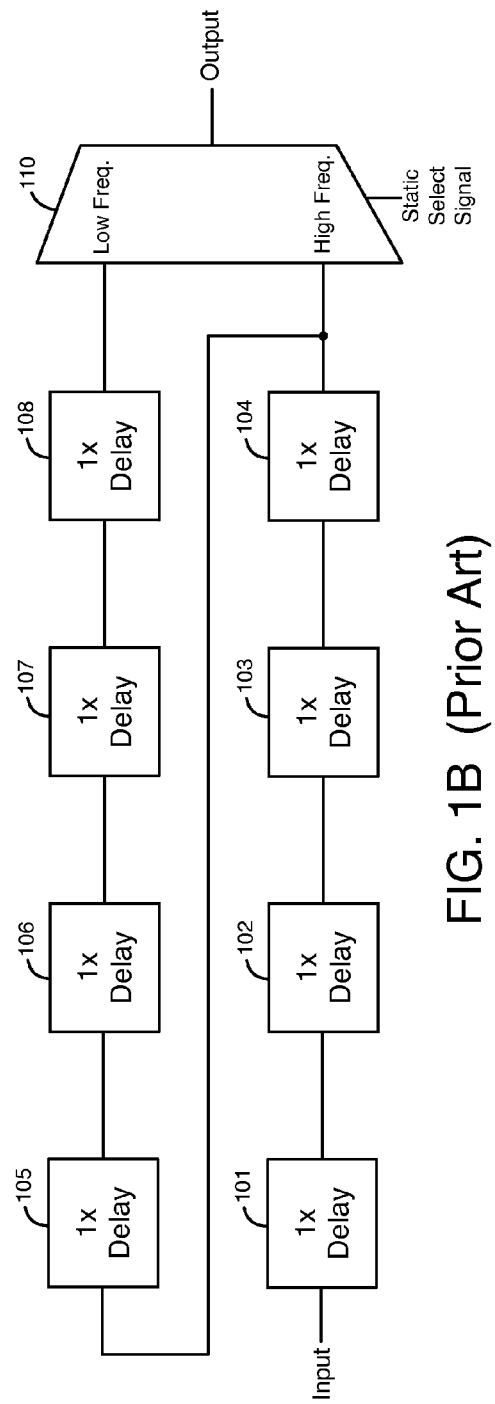
FIG. 1B illustrates the circuit architecture of each of the delay circuits shown in FIG. 1A.

A delay-locked loop (DLL) circuit containing the circuit architecture of FIGS. 1A and 1B has a number of different issues. Because the number of delay circuits 10-25 in FIG. 1A used to generate FBCK changes to support different frequencies, it may become difficult to achieve a required phase shift over the supported frequency range. For example, double data rate (DDR) memory data capture requires a reliable phase shift of 90 degrees to place a sampling clock signal in the middle of the data sampling window. This phase shift is not possible with 6 or 10 delay circuits in the delay line, which may cause problems in data and clock signals having higher frequencies. In addition, higher frequency clock signals require a smaller number of delay circuits in the delay line, which reduces the phase options that are important to support features such as leveling for DDR3 memory applications.

To support a wide continuous frequency range in a DLL, each frequency range that is supported by the delay line of FIGS. 1A-1B should have a sufficient overlap across process, supply voltage, and temperature (PVT) corners. The overlap between supported frequency ranges causes an overall smaller continuous frequency range. Designing delay circuits with constraints on minimum and maximum frequencies across PVT corners is very difficult and limits the choices of the delay circuit structure. Most of the variable delay of the delay circuits is wasted in meeting the overlap constraints across PVT corners.

The multi-stage architecture of FIGS. 1A-1B impacts the intrinsic delay and thus the maximum frequency achievable by the DLL without reducing the number of stages. The structure is not symmetric at every point along the delay path of delay circuits 101-108.

Because delay circuits 101-108 are buffers, any duty cycle distortion caused by one of delay circuits 101-108 accumulates along the path. The distortion is worst for the 16 stage high frequency delay path. The limitations of hitting overlap constraints usually results in each of the delay circuits 10-25 having many smaller delay circuits. Typically, each additional delay circuit added to a delay line in a DLL has progressively less benefits. For example, the use of different channel lengths can cause uneven delay steps in the delay circuits.

Figure 2:
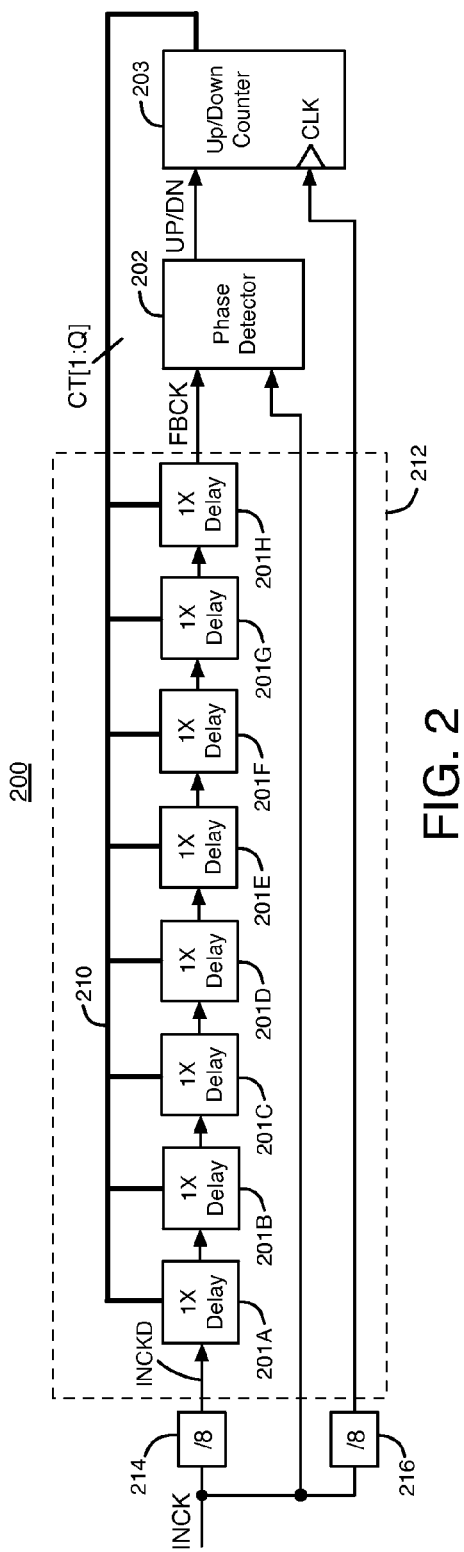
FIG. 2 illustrates an example of a delay-locked loop (DLL) circuit, according to an embodiment of the present invention.

FIG. 2 illustrates an example of a delay-locked loop (DLL) circuit 200, according to an embodiment of the present invention. DLL 200 shown in FIG. 2 includes 8 delay circuit elements 201A-201H, phase detector 202, up/down counter 203, bus 210, and frequency divider circuits 214 and 216.

Delay circuit elements 201A-201H, phase detector 202, up/down counter 203, bus 210, and frequency divider circuits 214 and 216 form a digitally controlled delay-locked loop (DLL) circuit. DLL 200 can have any suitable number of delay circuit elements 201 coupled in series in a delay chain. Eight delay circuit elements 201 are shown in FIG. 2 merely as an example.

Circuit 200 is typically fabricated on an integrated circuit. Circuits of the present invention can, for example, be fabricated on an application specific integrated circuit (ASIC) or a programmable logic integrated circuit, such as a field programmable gate array (FPGA).

Frequency divider circuit 214 divides the frequency of input clock signal INCK by 8 to generate a frequency divided clock signal INCKD. The frequency divided clock signal INCKD is routed to an input of delay circuit element 201A. Delay circuit elements 201A-201H are coupled together in series in the delay path of clock signal INCKD to form a delay chain. Delay circuit elements 201A-201H delay clock signal INCKD to generate a periodic feedback clock signal FBCK. The 8 delay circuit elements 201A-201H generate a delay in FBCK that varies based on changes in the logic states of count signals CT[1:Q].

Each of the delay circuit elements 201A-201H in the delay chain has the same delay at any given time. The delay of delay circuit elements 201A-201H is referred to as 1×. Each of the delay circuit elements 201A-201H adds an additional delay of 1× to feedback clock signal FBCK relative to clock signal INCKD. As a result, the feedback clock signal FBCK is delayed by 8× relative to the clock signal INCKD.

When INCK and FBCK are aligned in phase, each of the delay circuit elements 201A-201H delays FBCK by a delay of 45°, and delay circuit elements 201A-201H together delay FBCK by 360°. 45° refers to one-eighth of a period of INCK, and 360° refers to one full period of INCK. Thus, FBCK is delayed by one full period of INCK after the phase of INCKD. FBCK and INCKD have the same frequency.

The 8 output clock signals of the 8 delay circuit elements 201A-201H have relative phase offsets of 45°, 90°, 135°, 180°, 225°, 270°, 315°, and 360°, respectively. These phase offsets are relative to a period of INCK. If the periods of bits in an input data signal are one-half the period of a sampling clock signal, the 8 output clock signals of delay circuit elements 201A-201H can be used to generate 90° phase shifts in the sampling clock signal relative to the bit periods of the input data signal.

In one embodiment, each of the delay circuit elements 201A-201H has the same delay circuit architecture and the same size transistors as each of the other delay circuit elements 201A-201H.

Input clock signal INCK is routed to a first input terminal of phase detector 202. Frequency divider circuit 216 divides the frequency of input clock signal INCK by 8 to generate a second frequency divided clock signal. The second frequency divided clock signal is routed to a clock CLK input terminal of up/down counter 203. The feedback clock signal FBCK is generated at an output terminal of delay circuit element 201H and is routed to a second input terminal of phase detector 202. Phase detector 202 compares the phase of the feedback clock signal FBCK to the phase of the input clock signal INCK to generate a digital UP/DN signal.

Up/down counter 203 generates a Q number of digital count signals CT[1:Q] in response to the second frequency divided clock signal and the UP/DN signal. Up/down counter 203 can, for example, generate 5 digital count signals (Q=5). The digital count signals are referred to as count signals CT[1:Q]. The count signals CT[1:Q] are transmitted in parallel through a bus 210 to input terminals of each of the delay circuit elements 201A-201H. The count signals CT[1:Q] are Gray coded, for example, using a simple Gray code. The Gray coded value of the count signals CT[1:Q] determines the delay of each of the delay circuit elements 201A-201H.

The function of the delay-locked loop (DLL) circuit 200 is to generate a combined delay through delay circuit elements 201A-201H that causes the phase of FBCK to be 360 degrees behind the phase of INCK. 360 degrees refers to a full period of INCK. DLL 200 adjusts the variable delay of delay circuit elements 201A-201H by varying the Gray coded value of count signals CT[1:Q], which control the variable delays of delay circuit elements 201A-201H.

When the phase of the feedback clock signal FBCK is less than 360° behind the phase of the input clock signal INCK, phase detector 202 generates a logic high state in the UP/DN signal. When the UP/DN signal is in a logic high state, up/down counter 203 increases the Gray coded value of the count signals CT[1:Q], causing the delay of each of the delay circuit elements 201A-201H to increase.

When the phase of the feedback clock signal FBCK is more than 360° behind the phase of the input clock signal INCK, phase detector 202 generates a logic low state in the UP/DN signal. When the UP/DN signal is in a logic low state, up/down counter 203 decreases the Gray coded value of the count signals CT[1:Q], causing the delay of each of the delay circuit elements 201A-201H to decrease.

The change in the delay of each of the delay circuit elements 201A-201H that occurs when the Gray coded value of the count signals CT[1:Q] increases or decreases by one is referred to as the step delay $D_{STEP}$. When the Gray coded value of the count signals CT[1:Q] increases by 1, the total delay of the delay chain formed by delay circuit elements 201A-201H increases by $8 \times D_{STEP}$. When the Gray coded value of the count signals CT[1:Q] decreases by 1, the total delay of the delay chain formed by delay circuit elements 201A-201H decreases by $8 \times D_{STEP}$.

When the combined delay of delay circuit elements 201A-201H causes the phase of the FBCK signal to be 360 degrees behind the phase of the input clock signal INCK, DLL circuit 200 is in lock mode. In the lock mode of the DLL, counter 203 maintains the logic states of the count signals CT[1:Q] constant. Phase detector 202 monitors when DLL 200 is in lock mode. When phase detector 202 detects that DLL 200 is not in lock mode, an enable signal (not shown) that is transmitted from phase detector 202 to counter 203 causes counter 203 to adjust the count signals CT[1:Q] in response to the UP/DN signal. When phase detector 202 detects that DLL 200 is in lock mode, phase detector 202 causes the enable signal to transition to a state that causes counter 203 to maintain the count signals CT[1:Q] in constant logic states. When DLL 200 goes out of lock mode, phase detector 202 causes the enable signal to allow counter 203 to adjust the count signals again.

Figure 3:
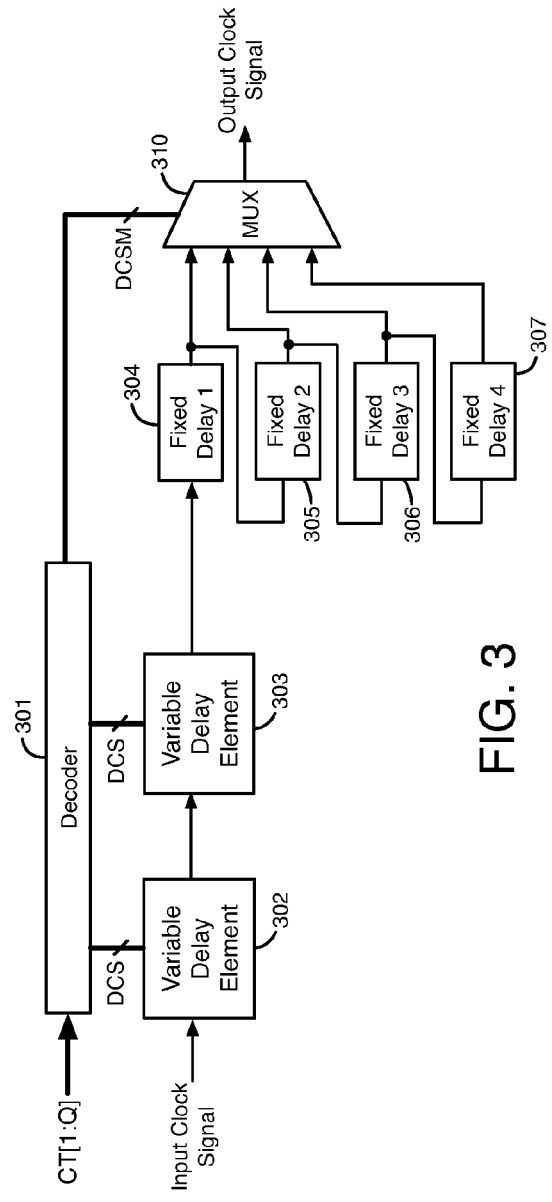
FIG. 3 illustrates an example of a variable delay circuit, according to an embodiment of the present invention.

FIG. 3 illustrates an example of a variable delay circuit, according to an embodiment of the present invention. The variable delay circuit of FIG. 3 includes decoder 301, variable delay elements 302-303, fixed delay circuits 304-307, and multiplexer 310. The variable delay circuit of FIG. 3 is an example of each of the delay circuit elements 201A-201H shown in FIG. 2. Thus, in one embodiment, each of the 8 delay circuit elements 201A-201H includes decoder 301, variable delay elements 302-303, fixed delay circuits 304-307, and multiplexer 310 coupled as shown in FIG. 3.

A decoder circuit 301 decodes the Gray coded count signals CT[1:Q] to generate decoded control signals DCS and DCSM. Decoded control signals DCS and DCSM can include any appropriate number of individual digital signals. In DLL 200, each of the delay circuit elements 201A-201H has a decoder circuit 301 that controls the variable delay circuits within that delay circuit element.

The variable delay circuit of FIG. 3 is configured to delay an input clock signal to generate an output clock signal. Variable delay elements 302-303 are coupled in series. Variable delay element 302 delays the input clock signal to generate a delayed output clock signal. Variable delay element 303 delays the delayed output clock signal of variable delay circuit 302 to generate a delayed output clock signal that is transmitted to an input of fixed delay circuit 304. Decoded control signals DCS control the delays of variable delay elements 302-303. The delays of variable delay elements 302-303 vary based on changes in the logic states of control signals DCS.

Fixed delay circuit 304 delays the delayed output clock signal of variable delay element 303 to generate a delayed output clock signal. Fixed delay circuit 305 is coupled to delay the delayed output clock signal of fixed delay circuit 304 to generate a delayed output clock signal. Fixed delay circuit 306 is coupled to delay the delayed output clock signal of fixed delay circuit 305 to generate a delayed output clock signal. Fixed delay circuit 307 is coupled to delay the delayed output clock signal of fixed delay circuit 306 to generate a delayed output clock signal.

Multiplexer 310 selects the delayed output clock signal of one of fixed delay circuits 304-307 based on the logic states of decoded control signals DCSM. Decoded control signals DCSM determine which of the delayed output clock signals of fixed delay circuits 304-307 is selected to be the output signal of multiplexer 310. Multiplexer 310 transmits the selected delayed output clock signal to its output as the output clock signal of the variable delay circuit of FIG. 3.

Figure 4:
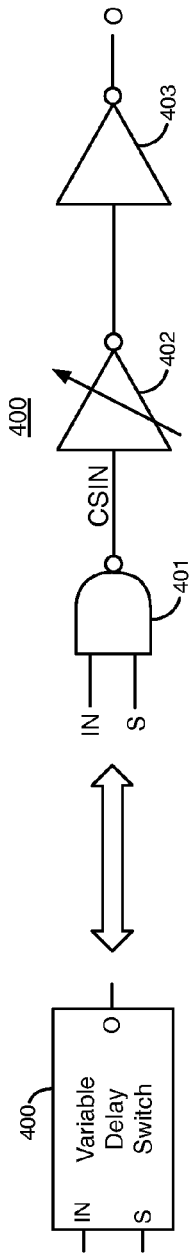
FIG. 4 illustrates an example of a variable delay switch circuit, according to an embodiment of the present invention.

FIG. 4 illustrates an example of a variable delay switch circuit 400, according to an embodiment of the present invention. Variable delay switch circuit 400 is an example of each of the variable delay elements 302-303 in FIG. 3. Variable delay switch circuit 400 includes NAND logic gate 401, current starving inverter 402, and inverter circuit 403. Circuits 401-403 are coupled in series to delay a clock signal at input IN of NAND gate 401 to generate a delayed clock signal at output O of inverter 403. NAND gate 401 also receives an input select signal at input S.

Figure 5:
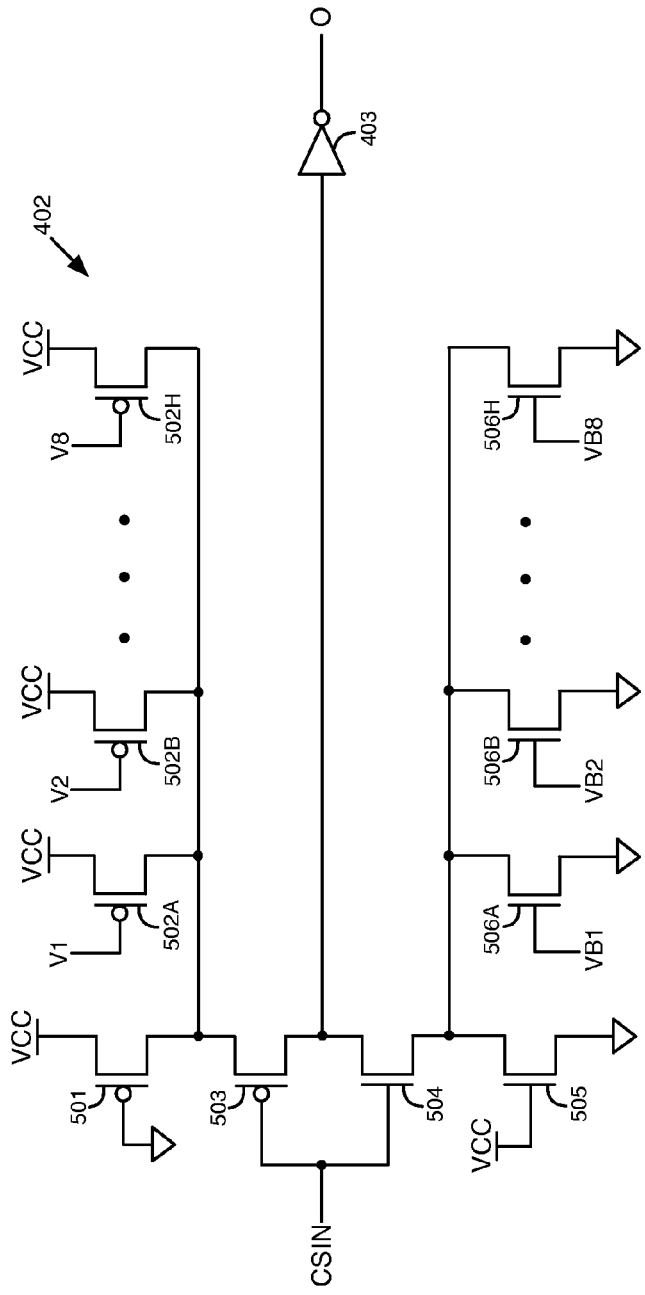
FIG. 5 is a schematic diagram that illustrates an example of a current starving inverter circuit.

FIG. 5 is a schematic diagram that illustrates an example of an architecture of current starving inverter circuit 402. The current starving inverter shown in FIG. 5 is in delay circuits 101-108 in the prior art design of FIG. 1B. The current starving inverter 402 shown in FIG. 5 is also an example of the current starving inverter circuit 402 in the variable delay switch circuit 400 of FIG. 4.

In FIG. 5, current starving inverter circuit 402 includes p-channel metal oxide semiconductor field-effect transistors (MOSFETs) 501, 503, and 502A-502H. Current starving inverter circuit 402 also includes n-channel MOSFETs 504, 505, and 506A-506H. Although current starving inverter circuit 402 includes 8 transistors 502A-502H and 8 transistors 506A-506H, current starving inverter circuit 402 can include any suitable number of transistors 502 and 506.

Transistors 503 and 504 are coupled together to form an inverter. The gate terminals of transistors 503 and 504 are coupled to receive input clock signal CSIN from the output of NAND gate 401, the drains of transistors 503 and 504 are coupled to the input of inverter 403, and inverter 403 generates the delayed output clock signal of circuit 400 at output O.

The gate of p-channel transistor 501 is coupled to ground, the source of transistor 501 is coupled to supply voltage VCC, and the drain of transistor 501 is coupled to the source of transistor 503. When the supply voltage VCC is at its nominal operating voltage, transistor 501 is on to conduct current in its saturation region from supply voltage VCC to transistor 503. The gate of n-channel transistor 505 is coupled to supply voltage VCC, the source of transistor 505 is coupled to ground, and the drain of transistor 505 is coupled to the source of transistor 504. When the supply voltage VCC is at its nominal operating voltage, transistor 505 is on to conduct current in its saturation region from transistor 504 to ground.

P-channel transistors 502A-502H are coupled in parallel between the supply voltage VCC and the source of transistor 503. N-channel transistors 506A-506H are coupled in parallel between the source of transistor 504 and ground.

Decoded control signals DCS are used to generate gate control signals V1-V8 and VB1-VB8. Gate control signals V1-V8 are transmitted to the gates of p-channel transistors 502A-502H, respectively. Gate control signals VB1-VB8 are transmitted to the gates of n-channel transistors 506A-506H, respectively. Gate control signals VB1-VB8 are the logical inverses of gate control signals V1-V8, respectively.

The Gray coded value of the count signals CT[1:Q] determines the number of transistors 502 and 506 that are turned on to supply current through transistors 503-504. Counter circuit 203 adjusts the Gray coded value of the count signals to vary the delay of current starving inverters 402 by varying the number of transistor pairs 502/506 that are turned on.

Decoder 301 selects the logic states of the V1-V8 and VB1-VB8 control signals based on the Gray coded value of the count signals CT[1:Q]. Decoder 301 generates an additional 1 in the V1-V8 signals in response to each increase of 1 in the Gray coded value of the count signals. Decoder 301 generates an additional 0 in the V1-V8 signals in response to each decrease of 1 in the Gray coded value of the count signals. A logic high state (1) at the gate of one of transistors 502A-502H turns off that transistor, and a logic low state (0) at the gate of one of transistors 502A-502H turns on that transistor in its saturation region. A logic low state (0) at the gate of one of transistors 506A-506H turns off that transistor, and a logic high state (1) at the gate of one of transistors 506A-506H turns on that transistor in its saturation region. Thus, each increase in the count signals CT[1:Q] decreases the current through current starving inverter 402, and each decrease in the count signals CT[1:Q] increases the current through current starving inverter 402.

Current starving inverter 402 generates a minimum delay $D_{MIN}$ and a maximum current $I_{MAX}$ through transistors 503-504 when all of the transistors 502A-502H and 506A-506H are on and conducting current in their saturation regions. Current starving inverter 402 generates a maximum delay $D_{MAX}$ and a minimum current $I_{MIN}$ through transistors 503-504 when all of the transistors 502A-502H and 506A-506H are off and not conducting current. The minimum current $I_{MIN}$ is generated by transistors 501 and 505. The capacitance when $I_{MAX}$ is flowing through transistors 503-504 is the same as the capacitance when $I_{MIN}$ is flowing through transistors 503-504.

According to one embodiment, the width-to-length (W:L) channel ratio of each of the transistors 502A-502H can be the same, and the W:L channel ratio of each of the transistors 506A-506H can be the same. In this embodiment, the current through transistors 503-504 ideally increases linearly with each additional transistor pair 502/506 that is turned on. However, each additional transistor 502 adds capacitance at the source of transistor 503, and each additional transistor 506 adds capacitance at the source of transistor 504. According to another embodiment, the W:L channel ratios of transistors 502A-502H increase from left to right in FIG. 5, and the W:L channel ratios of transistors 506A-506H increase from left to right in FIG. 5. During the design of current starving inverter 402, the W:L channel ratios of transistors 502 and 506 can be selected to cause current starving inverter 402 to generate a desired step delay.

Figure 6:
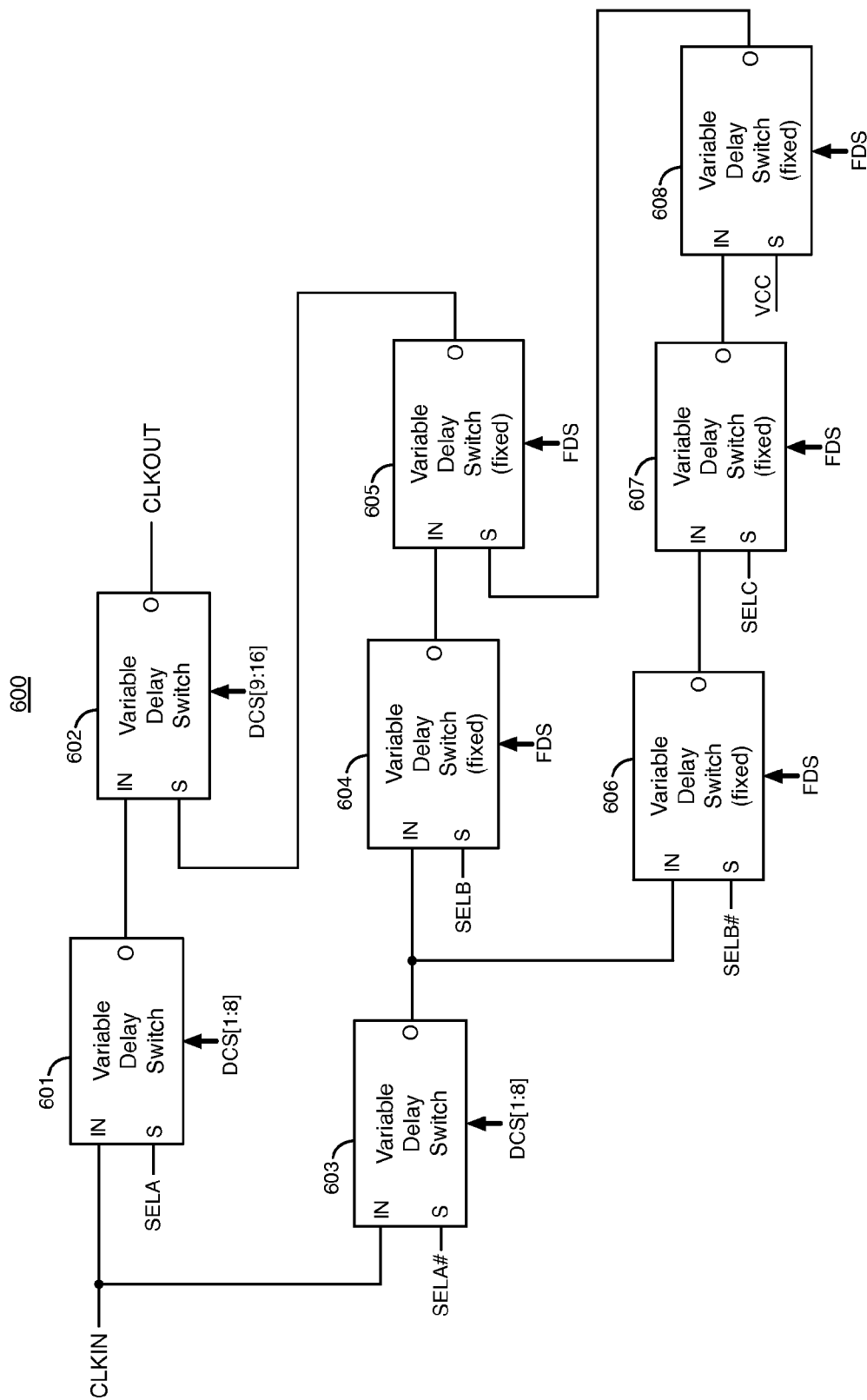
FIG. 6 illustrates another example of a variable delay circuit, according to an embodiment of the present invention.

FIG. 6 illustrates an example of a variable delay circuit 600, according to an embodiment of the present invention. Variable delay circuit 600 is an example of each of the 1× delay circuit elements 201A-201H shown in FIG. 2. Thus, in one embodiment, each of the 1× delay circuit elements 201A-201H includes the circuitry of variable delay circuit 600. According to another embodiment, variable delay circuit 600 can be used in a ring oscillator in a phase-locked loop (PLL) circuit.

Variable delay circuit 600 includes 8 variable delay switches 601-608. Variable delay switch circuit 400 shown in FIGS. 4-5 is an example circuit architecture for each one of the variable delay switches 601-608. Because variable delay switches 601-608 have the same circuit architecture, process variations have the same effects on the delays of switches 601-608.

Variable delay circuit 600 delays an input clock signal CLKIN to generate an output clock signal CLKOUT. Eight decoded control signals DCS[1:8] are transmitted from decoder 301 to inputs of variable delay switches 601 and 603, and eight additional decoded control signals DCS[9:16] are transmitted from decoder 301 to inputs of variable delay switch 602, as shown in FIG. 6. Decoded control signals DCS[1:8] control the delays of variable delay switches 601 and 603, and decoded control signals DCS[9:16] control the delay of variable delay switch 602.

The delay that variable delay circuit 600 provides to CLKOUT relative to CLKIN can be varied by changing the logic states of decoded control signals DCS. Decoded control signals DCS[1:8] vary the delays of variable delay switches 601 and 603 based on changes in the logic states of the count signals CT[1:Q] from counter 203. Decoded control signals DCS[9:16] vary the delay of variable delay switch 602 based on changes in the logic states of the count signals CT[1:Q] from counter 203. For example, decoded control signals DCS[1:16] can vary the delays of variable delay switches 601-603 by turning on or turning off more of transistors 502A-502H and 506A-506H in current starving inverters 402.

Fixed delay control signals FDS are transmitted to inputs of variable delay switches 604-608, as shown in FIG. 6. Fixed delay control signals FDS are set to constant logic states that do not vary during the operation of DLL 200. Fixed delay control signals FDS cause the delays of variable delay switches 604-608 to be set to their smallest programmable delay values. For example, fixed delay control signals FDS can be set to logic states that cause all 16 of transistors 502A-502H and 506A-506H to be turned on in each of variable delay switches 604-608, so that switches 604-608 provide their minimum programmable delay values to their output clock signals at outputs O. In this example, signals FDS set the logic states of signals V1-V8 and VB1-VB8 in switches 604-608. Control signals FDS cause variable delay switches 604-608 to remain at their minimum programmable delay values during the operation of DLL 200.

The delay that variable delay circuit 600 provides to output clock signal CLKOUT relative to input clock signal CLKIN can also be varied by changing the delay path that CLKIN takes through variable delay switches 601-608 to generate CLKOUT. The logic states of control signals SELA, SELA#, SELB, SELB#, and SELC control the delay path that CLKIN takes through variable delay switches 601-608 to generate CLKOUT. The logic states of control signals SELA, SELA#, SELB, SELB#, and SELC are varied to change the path that CLKIN takes through variable delay switches 601-608 to generate CLKOUT. Signal SELA# is the logical inverse of signal SELA, and signal SELB# is the logical inverse of signal SELB. The SELA, SELA#, SELB, SELB#, and SELC signals are generated in response to decoded control signals. These decoded control signals are generated by a decoder in response to the count signals CT[1:Q] from counter 203.

Signal SELA is transmitted to the select input S of variable delay switch 601, and signal SELA# is transmitted to the select input of variable delay switch 603. When signal SELA is in a logic high state, and signal SELA# is in a logic low state, CLKIN propagates through variable delay switch 601 from its IN input to its O output and then through variable delay switch 602 from its IN input to its O output as output clock signal CLKOUT. In this example, CLKIN is not routed through variable delay switches 603-608.

Signal SELB is transmitted to the select input S of variable delay switch 604, and signal SELB# is transmitted to the select input S of variable delay switch 606. When signals SELA and SELB# are in logic low states, and signals SELA# and SELB are in logic high states, CLKIN propagates through variable delay switches 603, 604, 605, and 602, in that order, to generate CLKOUT. CLKIN propagates through variable delay switches 603-605 in serial from their IN inputs to their O outputs. The clock signal at the O output of variable delay switch 605 then propagates through variable delay switch 602 from its S input to its O output as CLKOUT. In this example, CLKIN propagates through two variable delay switches 602-603 having variable delays and two delay switches 604-605 that are programmed to have fixed delays.

Signal SELC is transmitted to the select input S of variable delay switch 607, and the supply voltage VCC (representing a logic high state) is transmitted to the select input S of variable delay switch 608. When signals SELA and SELB are in logic low states, and signals SELA#, SELB#, and SELC are in logic high states, CLKIN propagates through variable delay switches 603, 606, 607, 608, 605, and 602, in that order, to generate CLKOUT. CLKIN propagates through variable delay switches 603 and 606-608 in serial from their IN inputs to their O outputs. The clock signal at the O output of variable delay switch 608 then propagates through variable delay switch 605 from its S input to its O output. The clock signal at the O output of variable delay switch 605 then propagates through variable delay switch 602 from its S input to its O output as CLKOUT. In this example, CLKIN propagates through two variables delay switches 602-603 having variable delays and four delay switches 605-608 that are programmed to have fixed delays.

Each of the possible combinations of the SELA, SELA#, SELB, SELB#, and SELC signals described above causes an even number of variable delay switches to be located in the path between CLKIN and CLKOUT. As a result, the logic state of CLKOUT is not inverted relative to the logic state of CLKIN.

An example of the operation of circuit 600 is now described. Initially, SELA is in a logic high state, SELA# is in a logic low state, and CLKIN is routed only through variable delay switches 601-602. In order to increase the delay of variable delay circuit 600, DLL 200 initially increases the delays of variable delay switches 601-602 by changing the logic states of controls signals DCS[1:16] based on changes in the Gray coded value of count signals CT[1:Q]. When the delays of variable delay switches 601-602 are at their maximum values, DLL 200 reroutes CLKIN through switches 603-605 and 602, as described above, and at the same time, DLL 200 sets the delays of switches 602-603 to their minimum values. In one embodiment, the maximum delay of switch 602 minus the minimum delay of switch 602 plus the maximum delay of switch 603 minus the minimum delay of switch 603 equals the combined delays of switches 604-605, and the delay of circuit 600 does not change when CLKIN is rerouted through switches 603-605 and 602.

Subsequently, DLL 200 increases the delay of circuit 600 by increasing the delays of variable delay switches 602-603. DLL 200 increases the delays of variable delay switches 602-603 by changing the logic states of DCS[1:16] based on changes in the Gray coded value of count signals CT[1:Q]. When variable delay switches 602-603 are generating their maximum delays, DLL 200 reroutes CLKIN through switches 603, 606-608, 605, and 602, as described above, and at the same time, DLL 200 sets the delays of switches 602-603 to their minimum values. In one embodiment, the maximum delay of switch 602 minus the minimum delay of switch 602 plus the maximum delay of switch 603 minus the minimum delay of switch 603 equals the combined delays of switches 607-608, and the delay of circuit 600 does not change when CLKIN is rerouted through switches 603, 606-608, 605, and 602. Subsequently, DLL 200 increases the delay of circuit 600 by increasing the delays of variable delay switches 602-603 again.

Thus, variable delay circuit 600 can increase its delay beyond the delay of the variable delay switches by rerouting the input clock signal CLKIN through different delay paths. The different delay paths through variable delay circuit 600 can support different frequency ranges for the input reference clock signal INCK of DLL 200. The shortest delay path through switches 601-602 can be used to support high frequencies in INCK. The delay path through switches 603-605 and 602 can be used to support mid-range frequencies in INCK. The longest delay path through switches 603, 606-608, 605, and 602 can be used to support the lowest frequencies in INCK. Variable delay circuit 600 provides DLL 200 with a wide frequency range without having to design for frequency overlap.

Thus, variable delay circuit 600 provides a fast intrinsic path for high frequencies in input clock signals INCK and CLKIN. For low frequencies in INCK and CLKIN, an appropriate number of fixed delay stages are added to the path that CLKIN takes through variable delay circuit 600, as described above. Decoder 301 dynamically adds the fixed delay switches as needed to provide a uniform wide frequency range for DLL 200.

Variable delay circuit 600 is designed for the highest frequency required in INCK by adjusting the delay of variable delay switches 601-602. Variable delay circuit 600 achieves low frequency operation by adding the fixed delay switches. The fixed delay switches are coupled in parallel with the high frequency delay path through switches 601-602. The fixed delay switches do not affect the high frequency path. Variable delay circuit 600 needs only enough flexibility to compensate for PVT drift. Frequency lock is performed by adjusting the path that CLKIN takes through switches 601-608.

Table 1 below illustrates the operation of variable delay circuit 600. In this example, counter 203 starts counting up from 0. The example delays shown in Table 1 for count values 0-8 occur as the delays of switches 601-602 are increased from their minimum values to their maximum values. At count value 9, DLL 200 reroutes CLKIN through switches 603-605 and 602 and sets the delays of switches 602-603 back to their minimum values. In Table 1, the abbreviation ps refers to picoseconds, and variable delay switches 601-603 are assumed to have only 4 transistors 502 and only 4 transistors 506 that provide 4 steps. Each step adds an additional delay of 10 ps. Also in Table 1, the total delay shown in each row of the seventh column is obtained by adding together the delays from the second through the sixth columns of that row.

TABLE 1

| Value of CT | Variable Delay Switch 601/603 | | Variable Delay Switch 602 | | Fixed Delay from Path | Total |
|---|---|---|---|---|---|---|
| [1:Q] | Minimum | Variable | Minimum | Variable | Changing | Delay |
| 0 | 30 ps | 0 ps | 30 ps | 0 ps | 0 ps | 60 ps |
| 1 | 30 ps | 10 ps | 30 ps | 0 ps | 0 ps | 70 ps |
| 2 | 30 ps | 20 ps | 30 ps | 0 ps | 0 ps | 80 ps |
| 3 | 30 ps | 30 ps | 30 ps | 0 ps | 0 ps | 90 ps |
| 4 | 30 ps | 40 ps | 30 ps | 0 ps | 0 ps | 100 ps |
| 5 | 30 ps | 40 ps | 30 ps | 10 ps | 0 ps | 110 ps |
| 6 | 30 ps | 40 ps | 30 ps | 20 ps | 0 ps | 120 ps |
| 7 | 30 ps | 40 ps | 30 ps | 30 ps | 0 ps | 130 ps |
| 8 | 30 ps | 40 ps | 30 ps | 40 ps | 0 ps | 140 ps |
| 9 | 30 ps | 0 ps | 30 ps | 0 ps | 80 ps | 140 ps |
| 10 | 30 ps | 10 ps | 30 ps | 0 ps | 80 ps | 150 ps |
| 11 | 30 ps | 20 ps | 30 ps | 0 ps | 80 ps | 160 ps |

Because count signals CT[1:Q] are Gray coded, every increment and decrement in the value of count signals CT[1:Q] causes only 1 bit to change in the control signals DCS[1:16] that control the delay of variable delay circuit 600. Only one of the variable delay switches that are coupled in the delay path of CLKIN changes its delay in response to each change in a bit in the DCS[1:16] control signals. When the value of the count signals is 9, variable delay circuit 600 changes the path of CLKIN and reduces the delay of switch 602 to its minimum value, which may introduce jitter into CLKOUT depending on timing delay. To reduce jitter in CLKOUT, circuit 600 switches between the different delay paths only when the CLKIN and CLKOUT signals both have stable logic states. When CLKIN and CLKOUT both have stable logic states, no additional jitter is introduced into CLKOUT, because there are no edge transitions going through circuit 600 that can be affected by the changing delay of circuit 600.

Figure 7:
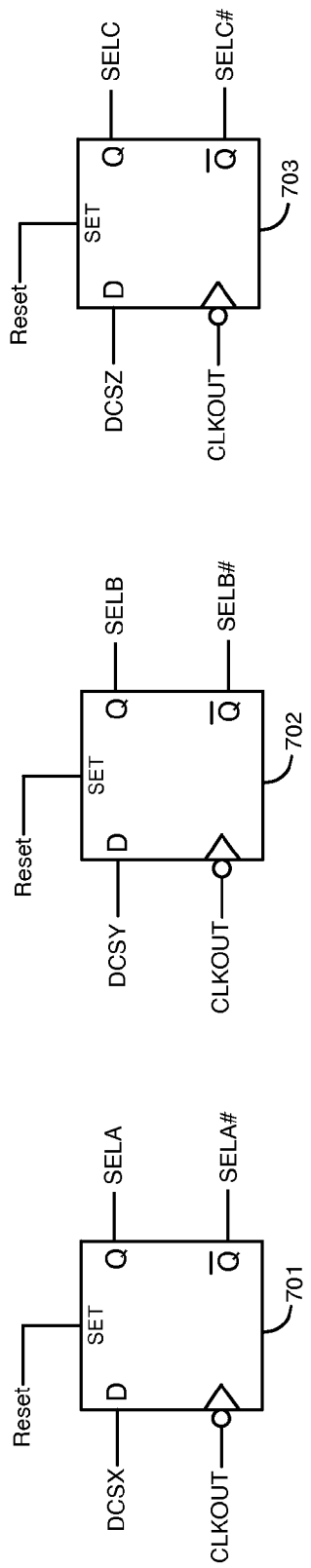
FIG. 7 illustrates an example of registers that can be used to generate select signals for selecting different paths through a variable delay circuit, according to an embodiment of the present invention.

FIG. 7 illustrates an example of registers that can be used to generate signals SELA, SELA#, SELB, SELB#, and SELC, according to an embodiment of the present invention. FIG. 7 illustrates three flip-flops 701-703. Each of delay circuits 201A-201H has a separate set of flip-flops 701-703.

Flip-flops 701-703 prevent variable delay circuit 600 from generating glitches in output clock signal CLKOUT when the delay path of CLKIN is changed. As a result, flip-flops 701-703 reduce jitter in CLKOUT.

Each of flip-flops 701-703 includes a D input, a clock input, a set input, a Q output, and an inverted Q bar output. Control signals DCSX, DCSY, and DCSZ are transmitted to the D inputs of flip-flops 701, 702, and 703, respectively. Control signals DCSX, DCSY, and DCSZ are generated by a decoder based on the Gray coded value of count signals CT[1:Q]. The output clock signal CLKOUT of variable delay circuit 600 is transmitted to the clock inputs of flip-flops 701-703. A Reset signal is transmitted to the set inputs of flip-flops 701-703. Flip-flops 701-703 generate output signals SELA, SELB, and SELC, respectively, at their Q outputs. Flip-flops 701-703 generate output signals SELA#, SELB#, and SELC#, respectively, at their inverted Q bar outputs. Signals SELA#, SELB#, and SELC# are the logical inverses of signals SELA, SELB, and SELC, respectively.

Flip-flops 701-703 store the logic states of the DCSX, DCSY, and DCSZ signals at their Q outputs as signals SELA, SELB, and SELC, respectively, in response to a rising edge in output clock signal CLKOUT. As a result, signals SELA, SELB, SELC, SELA#, SELB#, and SELC# change state only after a rising edge in CLKIN has already propagated through variable delay circuit 600 to cause a rising edge in CLKOUT.

Figure 8:
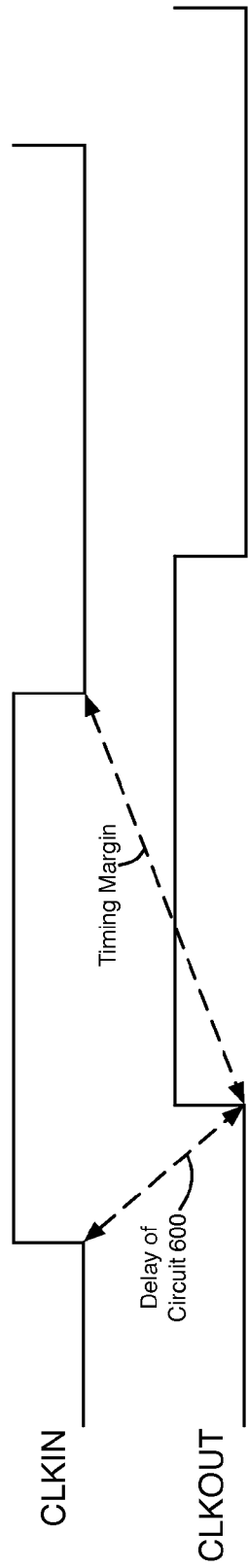
FIG. 8 is a timing diagram that illustrates an example of the input and output clock signals of the variable delay circuit of FIG. 6, according to an embodiment of the present invention.

FIG. 8 is a timing diagram that illustrates an example of the input and output clock signals CLKIN and CLKOUT of variable delay circuit 600. As shown in FIG. 8, rising edges in CLKIN and CLKOUT are separated by the delay of variable delay circuit 600. The time between a rising edge in CLKOUT and the next falling edge in CLKIN is referred to as the timing margin. The timing margin provides sufficient time for flip-flops 701-703 to change the logic states of the SELA, SELB, SELC, SELA#, and SELB# signals and for circuit 600 to change the path of CLKIN through switches 601-608 before the next edge in CLKIN. As a result, circuit 600 changes the path of CLKIN through switches 601-608 when CLKIN and CLKOUT have stable logic states to prevent causing glitches in CLKOUT.

Figure 9:
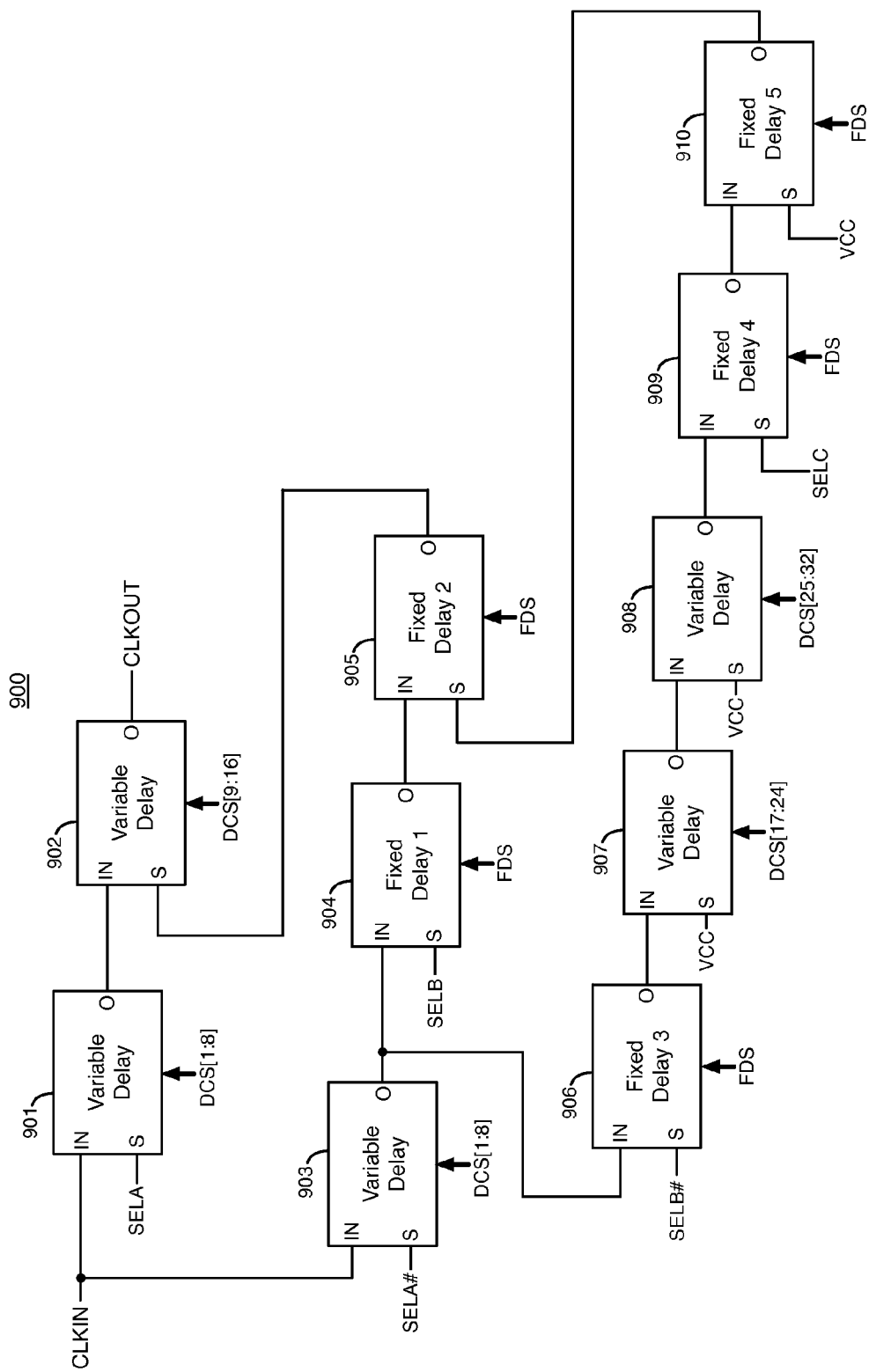
FIG. 9 illustrates another example of a variable delay circuit, according to an embodiment of the present invention.

FIG. 9 illustrates an example of a variable delay circuit 900, according to an embodiment of the present invention. Variable delay circuit 900 is an example of each of the 1× delay circuit elements 201A-201H shown in FIG. 2. Thus, in one embodiment, each of the 1× delay circuit elements 201A-201H includes the circuitry of variable delay circuit 900. According to another embodiment, variable delay circuit 900 can be used in a ring oscillator in a phase-locked loop (PLL) circuit.

Variable delay circuit 900 includes 10 variable delay switches 901-910. Variable delay switch circuit 400 shown in FIGS. 4-5 is an example circuit architecture for each one of the variable delay switches 901-910. Because variable delay switches 901-910 have the same circuit architecture, process variations have the same effects on the delays of switches 901-910.

Variable delay circuit 900 delays an input clock signal CLKIN to generate an output clock signal CLKOUT. Eight decoded control signals DCS[1:8] generated by a decoder control the delays of variable delay switches 901 and 903. Eight decoded control signals DCS[9:16] generated by a decoder control the delay of variable delay switch 902. Eight decoded control signals DCS[17:24] generated by a decoder control the delay of variable delay switch 907. Eight decoded control signals DCS[25:32] generated by a decoder control the delay of variable delay switch 908.

The delays of variable delay switches 901-903 and 907-908 vary based on changes in the decoded control signals DCS[1:32]. Decoded control signals DCS[1:32] are generated based on the decoded value of count signals CT[1:Q]. Decoded control signals DCS[1:32] vary the delay of one of the variable delay switches 901-903 and 907-908 in response to each change in the logic states of the count signals CT[1:Q] from counter 203, for example, by turning on or turning off more of the transistors 502A-502H and 506A-506H in the current starving inverter 402 in that variable delay switch.

Fixed delay control signals FDS are transmitted to inputs of variable delay switches 904-906 and 909-910, as shown in FIG. 9. Fixed delay control signals FDS are set to constant logic states that do not vary during the operation of DLL 200. Fixed delay control signals FDS cause the delays of variable delay switches 904-906 and 909-910 to be set to their smallest programmable delay values. For example, fixed delay control signals FDS can be set to logic states that cause all of transistors 502A-502H and 506A-506H to be turned on so that variable delay switches 904-906 and 909-910 provide their minimum programmable delay values to their output clock signals at outputs O. Control signals FDS cause variable delay switches 904-906 and 909-910 to remain at their minimum programmable delay values during the operation of DLL 200.

The delay that variable delay circuit 900 provides to output clock signal CLKOUT relative to input clock signal CLKIN can be varied by changing the delay path that CLKIN takes through variable delay switches 901-910 to generate CLKOUT. The logic states of select signals SELA, SELA#, SELB, SELB#, and SELC control the delay path that CLKIN takes through variable delay switches 901-910 to generate CLKOUT. The logic states of select signals SELA, SELA#, SELB, SELB#, and SELC are varied to change the delay path that CLKIN takes through variable delay switches 901-910 to generate CLKOUT.

Select signal SELA is transmitted to the S input of variable delay switch 901, and select signal SELA# is transmitted to the S input of variable delay switch 903. When SELA is in a logic high state, and SELA# is in a logic low state, CLKIN is routed through two variable delay switches 901-902 that have variable delays to generate CLKOUT. The delay of circuit 900 is varied by varying the delays of switches 901-902 based on changes in the count signals CT[1:Q].

Select signal SELB is transmitted to the S input of variable delay switch 904, and select signal SELB# is transmitted to the S input of variable delay switch 906. When the delays of variable delay switches 901-902 have both reached their maximum values, DLL 200 changes SELA to a logic low state, SELA# to a logic high state, SELB to a logic high state, and SELB# to a logic low state to provide additional increases in the delay of circuit 900. When SELA is in a logic low state, SELA# is in a logic high state, SELB is in a logic high state, and SELB# is in a logic low state, CLKIN is routed through variable delay switches 903, 904, 905, and 902, in that order, to generate CLKOUT. Thus, CLKIN is routed through two variable delay switches that have variable delays and two variable delay switches programmed to have fixed delays. The delays of switches 902-903 are set to their minimum values, and the delay of circuit 900 is then increased by increasing the delays of switches 902-903 based on changes in the count signals CT[1:Q].

Select signal SELC is transmitted to the S input of variable delay switch 909, and supply voltage VCC is transmitted to the S inputs of variable delay switches 907-908 and 910. When the delays of variable delay switches 902-903 have both reached their maximum values, DLL 200 changes SELB to a logic low state, SELB# to a logic high state, and SELC to a logic high state to provide additional increases in the delay of circuit 900. When SELA is in a logic low state, SELA# is in a logic high state, SELB is in a logic low state, SELB# is in a logic high state, and SELC is in a logic high state, CLKIN is routed through variable delay switches 903, 906, 907, 908, 909, 910, 905, and 902, in that order, to generate CLKOUT. Thus, CLKIN is routed through four variable delay switches that have variable delays and four variable delay switches that are programmed to have fixed delays. Also, the delays of switches 902-903 and 907-908 are set to their minimum delays. The delay of circuit 900 is then increased by increasing the delays of switches 902-903 and 907-908 based on changes in the count signals CT[1:Q].

According to another embodiment of a variable delay circuit, the path of CLKIN through the variable delay circuit can be rerouted through 6 variable delay switches that have variable delays and 6 variable delay switches that are programmed to have fixed delays. In yet another embodiment of a variable delay circuit, the path of CLKIN through the variable delay circuit can be rerouted through 8 variable delay switches that have variable delays and 8 variable delay switches that are programmed to have fixed delays.

Figure 10:
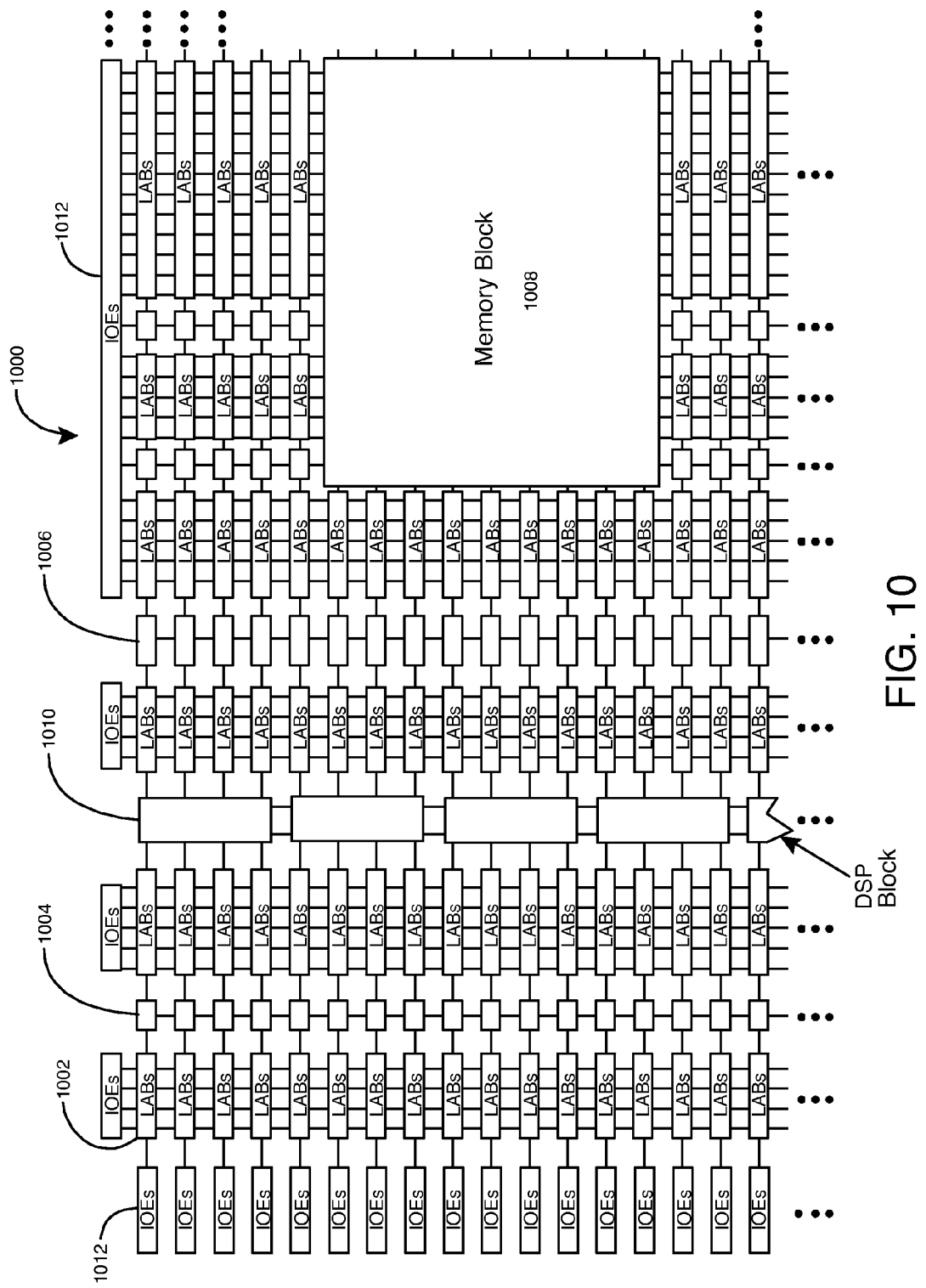
FIG. 10 is a simplified partial block diagram of a field programmable gate array (FPGA) that can include aspects of the present invention.

FIG. 10 is a simplified partial block diagram of a field programmable gate array (FPGA) 1000 that can include aspects of the present invention. FPGA 1000 is merely one example of an integrated circuit that can include features of the present invention.

Embodiments of the present invention can be used in numerous types of integrated circuits, such as field programmable gate arrays (FPGAs), programmable logic devices (PLDs), complex programmable logic devices (CPLDs), programmable logic arrays (PLAs), application specific integrated circuits (ASICs), general purpose processors, central processing units (CPUs), digital signal processors, controller integrated circuits, memory integrated circuits, analog integrated circuits, and digital integrated circuits.

FPGA 1000 includes a two-dimensional array of programmable logic array blocks (or LABs) 1002 that are interconnected by a network of column and row interconnect conductors of varying length and speed. LABs 1002 include multiple (e.g., 10) logic elements (or LEs).

An LE is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 1000 also includes a distributed memory structure including random access memory (RAM) blocks of varying sizes provided throughout the array. The RAM blocks include, for example, blocks 1004, blocks 1006, and block 1008. These memory blocks can also include shift registers and first-in-first-out (FIFO) buffers.

FPGA 1000 further includes digital signal processing (DSP) blocks 1010 that can implement, for example, multipliers with add or subtract features. Input/output elements (IOEs) 1012 located, in this example, around the periphery of the chip, support numerous single-ended and differential input/output standards. IOEs 1012 are coupled to pins. Each of the pins is an external terminal of the FPGA. It is to be understood that FPGA 1000 is described herein for illustrative purposes only and that the present invention can be implemented in many different types of integrated circuits.

Figure 11:
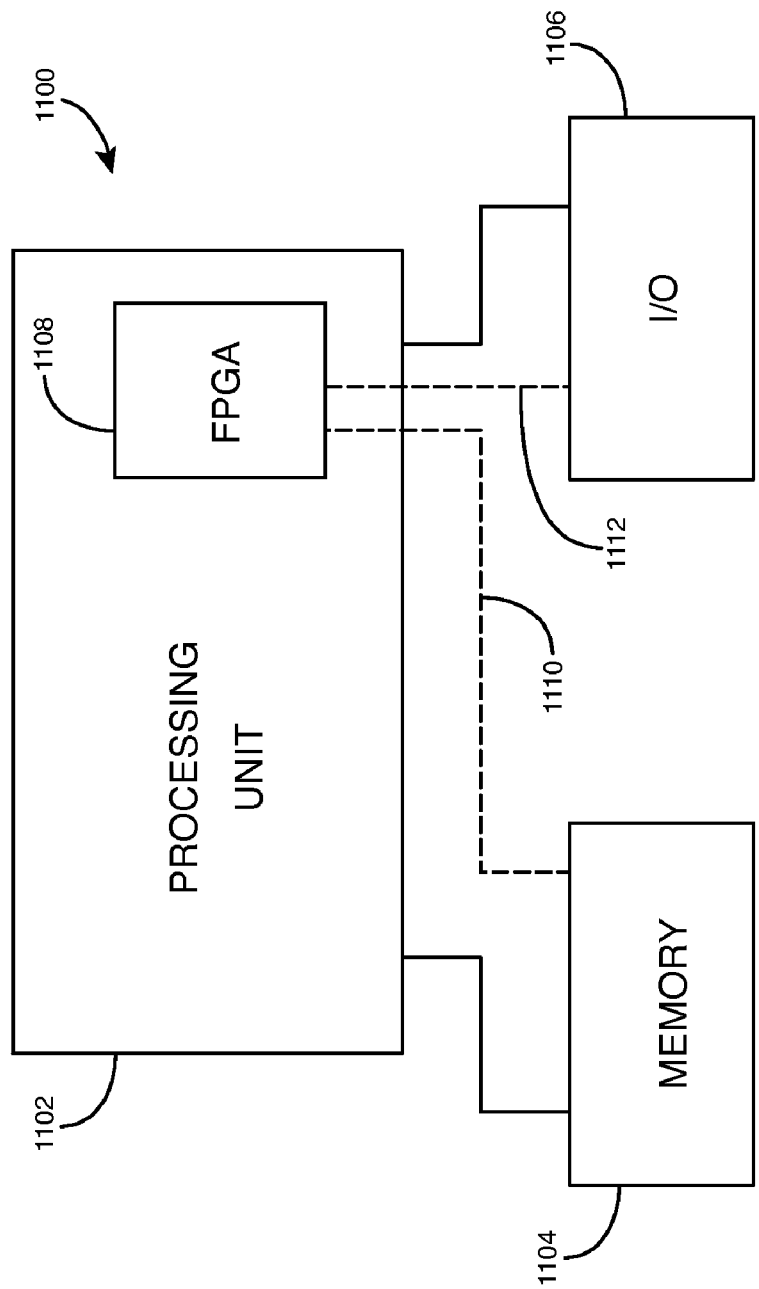
FIG. 11 shows a block diagram of an exemplary digital system that can embody techniques of the present invention.

The present invention can also be implemented in a system that has an FPGA as one of several components. FIG. 11 shows a block diagram of an exemplary digital system 1100 that can embody techniques of the present invention. System 1100 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 1100 can be provided on a single board, on multiple boards, or within multiple enclosures.

System 1100 includes a processing unit 1102, a memory unit 1104, and an input/output (I/O) unit 1106 interconnected together by one or more buses. According to this exemplary embodiment, an FPGA 1108 is embedded in processing unit 1102. FPGA 1108 can serve many different purposes within the system of FIG. 11. FPGA 1108 can, for example, be a logical building block of processing unit 1102, supporting its internal and external operations. FPGA 1108 is programmed to implement the logical functions necessary to carry on its particular role in system operation. FPGA 1108 can be specially coupled to memory 1104 through connection 1110 and to I/O unit 1106 through connection 1112.

Processing unit 1102 can direct data to an appropriate system component for processing or storage, execute a program stored in memory 1104, receive and transmit data via I/O unit 1106, or other similar functions. Processing unit 1102 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 1108 can control the logical operations of the system. As another example, FPGA 1108 acts as a reconfigurable processor that can be reprogrammed as needed to handle a particular computing task. Alternatively, FPGA 1108 can itself include an embedded microprocessor. Memory unit 1104 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A circuit comprising:
   first and second variable delay circuits; and
   first and second fixed delay circuits,
   wherein a delayed output signal is generated based on routing an input signal through a first delay path that comprises the first and the second variable delay circuits in a first control state, and wherein the delayed output signal is generated based on routing the input signal through a second delay path that comprises the second variable delay circuit and the first and the second fixed delay circuits in a second control state.

2. The circuit of claim 1 further comprising:
   a third variable delay circuit, wherein the delayed output signal is generated based on routing the input signal through the second delay path that comprises the second and the third variable delay circuits and the first and the second fixed delay circuits in the second control state.

3. The circuit of claim 2, wherein an output of the first variable delay circuit is coupled to a first input of the second variable delay circuit, wherein an output of the third variable delay circuit is coupled to an input of the first fixed delay circuit, wherein an output of the first fixed delay circuit is coupled to an input of the second fixed delay circuit, and wherein an output of the second fixed delay circuit is coupled to a second input of the second variable delay circuit.

4. The circuit of claim 2 further comprising:
   third, fourth, and fifth fixed delay circuits, wherein the delayed output signal is generated based on routing the input signal through a third delay path that comprises the second and the third variable delay circuits and the second, the third, the fourth, and the fifth fixed delay circuits in a third control state.

5. The circuit of claim 4, wherein an output of the third variable delay circuit is coupled to an input of the first fixed delay circuit and to an input of the third fixed delay circuit, wherein an output of the third fixed delay circuit is coupled to an input of the fourth fixed delay circuit, wherein an output of the fourth fixed delay circuit is coupled to an input of the fifth fixed delay circuit, wherein an output of the fifth fixed delay circuit is coupled to an input of the second fixed delay circuit, and wherein an output of the second fixed delay circuit is coupled to an input of the second variable delay circuit.

6. The circuit of claim 4 further comprising:
   fourth and fifth variable delay circuits, wherein the delayed output signal is generated based on routing the input signal through the third delay path that comprises the second, the third, the fourth, and the fifth variable delay circuits and the second, the third, the fourth, and the fifth fixed delay circuits in the third control state.

7. The circuit of claim 6, wherein an output of the third variable delay circuit is coupled to an input of the first fixed delay circuit and to an input of the third fixed delay circuit, wherein an output of the third fixed delay circuit is coupled to an input of the fourth variable delay circuit, wherein an output of the fourth variable delay circuit is coupled to an input of the fifth variable delay circuit, wherein an output of the fifth variable delay circuit is coupled to an input of the fourth fixed delay circuit, wherein an output of the fourth fixed delay circuit is coupled to an input of the fifth fixed delay circuit, wherein an output of the fifth fixed delay circuit is coupled to an input of the second fixed delay circuit, and wherein an output of the second fixed delay circuit is coupled to an input of the second variable delay circuit.

8. The circuit of claim 1, wherein the input signal is rerouted from the first delay path to the second delay path when the first variable delay circuit is generating a maximum delay of the first variable delay circuit and the second variable delay circuit is generating a maximum delay of the second variable delay circuit.

9. The circuit of claim 4, wherein the input signal is rerouted from the first delay path to the second delay path when the first variable delay circuit is generating a maximum delay of the first variable delay circuit and the second variable delay circuit is generating a maximum delay of the second variable delay circuit, and
   wherein the input signal is rerouted from the second delay path to the third delay path when the second variable delay circuit is generating a maximum delay of the second variable delay circuit and the third variable delay circuit is generating a maximum delay of the third variable delay circuit.

10. A circuit comprising:
    first and second variable delay circuits;
    first and second fixed delay circuits; and
    a multiplexer circuit, wherein the multiplexer circuit generates a delayed output signal based on one of first or second delayed input signals in response to a first control signal, wherein the first delayed input signal is delayed by the first and the second variable delay circuits and the first fixed delay circuit, and wherein the second delayed input signal is delayed by the first and the second variable delay circuits and the first and the second fixed delay circuits.

11. The circuit of 10 further comprising:
    a third fixed delay circuit, wherein the multiplexer circuit generates the delayed output signal based on one of the first delayed input signal, the second delayed input signal, or a third delayed input signal, wherein the third delayed input signal is delayed by the first and the second variable delay circuits and the first, the second, and the third fixed delay circuits.

12. The circuit of 11 further comprising:
    a fourth fixed delay circuit, wherein the multiplexer circuit generates the delayed output signal based on one of the first delayed input signal, the second delayed input signal, the third delayed input signal, or a fourth delayed input signal, wherein the fourth delayed input signal is delayed by the first and the second variable delay circuits and the first, the second, the third, and the fourth fixed delay circuits.

13. The circuit of claim 10, further comprising a phase detector, wherein delays of the first and the second variable delay circuits vary based on an output signal of the phase detector.

14. The circuit of claim 10, wherein each of the first and the second variable delay circuits comprises a logic gate circuit and a current starving circuit coupled to an output of the logic circuit.

15. A method comprising:
    enabling a first delay path comprising first and second variable delay circuits;
    generating a delayed output signal based on an input signal using the first and the second variable delay circuits in the first delay path;
    enabling a second delay path comprising the second variable delay circuit, a third variable delay circuit, and first and second fixed delay circuits; and
    generating the delayed output signal based on the input signal using the second variable delay circuit, the third variable delay circuit, and the first and the second fixed delay circuits in the second delay path.

16. The method of claim 15 further comprising:
enabling a third delay path comprising the second and the third variable delay circuits and the second, a third, a fourth, and a fifth fixed delay circuits; and
generating the delayed output signal based on the input signal using the second and the third variable delay circuits and the second, the third, the fourth, and the fifth fixed delay circuits in the third delay path.

17. The method of claim 16, wherein the third delay path comprises the second and the third variable delay circuits, fourth and fifth variable delay circuits, and the second, the third, the fourth, and the fifth fixed delay circuits.

18. The method of claim 16, wherein enabling a first delay path comprising first and second variable delay circuits comprises asserting a first control signal provided to the first variable delay circuit.

19. The method of claim 18, wherein enabling a second delay path comprising the second variable delay circuit, a third variable delay circuit, and first and second fixed delay circuits comprises asserting a second control signal provided to the third variable delay circuit and asserting a third control signal provided to the first fixed delay circuit.

20. The method of claim 19, wherein enabling a third delay path comprising the second and the third variable delay circuits and the second, a third, a fourth, and a fifth fixed delay circuits comprises asserting a fourth control signal provided to the third fixed delay circuit and asserting a fifth control signal provided to the fourth fixed delay circuit, and wherein delays of the first and the second fixed delay circuits are fixed based on fixed delay control signals.

* * * * *